United States Patent
Cho et al.

(10) Patent No.: US 7,227,258 B2
(45) Date of Patent: Jun. 5, 2007

(54) MOUNTING STRUCTURE IN INTEGRATED CIRCUIT MODULE

(75) Inventors: Jeong-Hyeon Cho, Seoul (KR); Byung-Se So, Gyeonggi-do (KR); Jin-Kyu Chang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 13 days.

(21) Appl. No.: 10/988,390

(22) Filed: Nov. 12, 2004

(65) Prior Publication Data

US 2005/0104206 A1    May 19, 2005

(30) Foreign Application Priority Data

Nov. 13, 2003 (KR) ..................... 10-2003-0080105

(51) Int. Cl.
*H01L 23/34* (2006.01)

(52) U.S. Cl. ............... 257/723; 257/686; 257/E25.013; 257/E23.063

(58) Field of Classification Search ................ 257/686, 257/723, E23.063, E25.013
See application file for complete search history.

(56) References Cited

U.S. PATENT DOCUMENTS

| | | | |
|---|---|---|---|
| 5,684,677 A | | 11/1997 | Uchida et al. |
| 5,904,497 A | * | 5/1999 | Akram ................. 438/106 |
| 6,005,778 A | * | 12/1999 | Spielberger et al. ........ 361/770 |
| 6,169,325 B1 | | 1/2001 | Azuma et al. |
| 6,351,028 B1 | * | 2/2002 | Akram ................. 257/686 |
| 6,836,011 B2 | * | 12/2004 | Azuma ................. 257/700 |
| 2002/0081838 A1 | * | 6/2002 | Bohr ................... 438/637 |

* cited by examiner

*Primary Examiner*—Andy Huynh
(74) *Attorney, Agent, or Firm*—Marger Johnson & McCollom, P.C.

(57) ABSTRACT

Embodiments of the present invention may include an integrated circuit module structure for a high-density mounting. An embodiment may include a wiring board, having a mounting space with a mounting length determined in a first direction and a mounting width determined in a second direction, on at least one surface thereof, and a plurality of integrated circuit packages having a package mounting combination length longer than the mounting length of the wiring board. An embodiment may also have some packages among the plurality of integrated circuit packages mounted directly on the mounting space, while other packages are mounted indirectly on the mounting space. The present embodiment may have packages that are overlapped horizontally and vertically distant from one another. Embodiments allow a plurality of chips or packages to be mounted in a limited area without changing a form factor of integrated circuit module even when integrated circuit chip or package size increases.

9 Claims, 9 Drawing Sheets

MOUNTING STRUCTURE IN INTEGRATED CIRCUIT MODULE

CROSS REFERENCE TO RELATED APPLICATIONS

This application claims priority from Korean Patent Application No. 2003-80105, filed on Nov. 13, 2003, the contents of which are incorporated herein by reference in their entirety.

FIELD OF THE INVENTION

The present invention relates to semiconductor device mounting, and more particularly, to an integrated circuit module for effectively mounting a plurality of semiconductor chips or a plurality of integrated circuit packages on a card or wiring board.

PRIOR ART OF THE INVENTION

Integrated circuit (IC) packages with encapsulated semiconductor chips are continually decreasing in size. Chip size packages (CSP) were recently developed having roughly the size of a bare chip.

Users of electronic systems for communications or computing require continually higher performance, resulting in increasing needs for high-speed and high-integration in semiconductor memory devices such as DRAM (Dynamic Random Access Memory).

As electronic systems trend toward higher performance, attendant semiconductor memory devices need to have larger storage capacities. However, as chips or packages in semiconductor memory devices become larger, difficulties arise in mounting a plurality of chips or packages on a board having a determined space.

Memory density is gradually increasing with process technology developments, thus an increase in memory capacity may not necessarily increase memory chip size or package size. However, improvements in memory device technology may not always be sufficient. Memory devices often use general process technology, which can result in a relatively large memory chip or package.

Figure 1A:
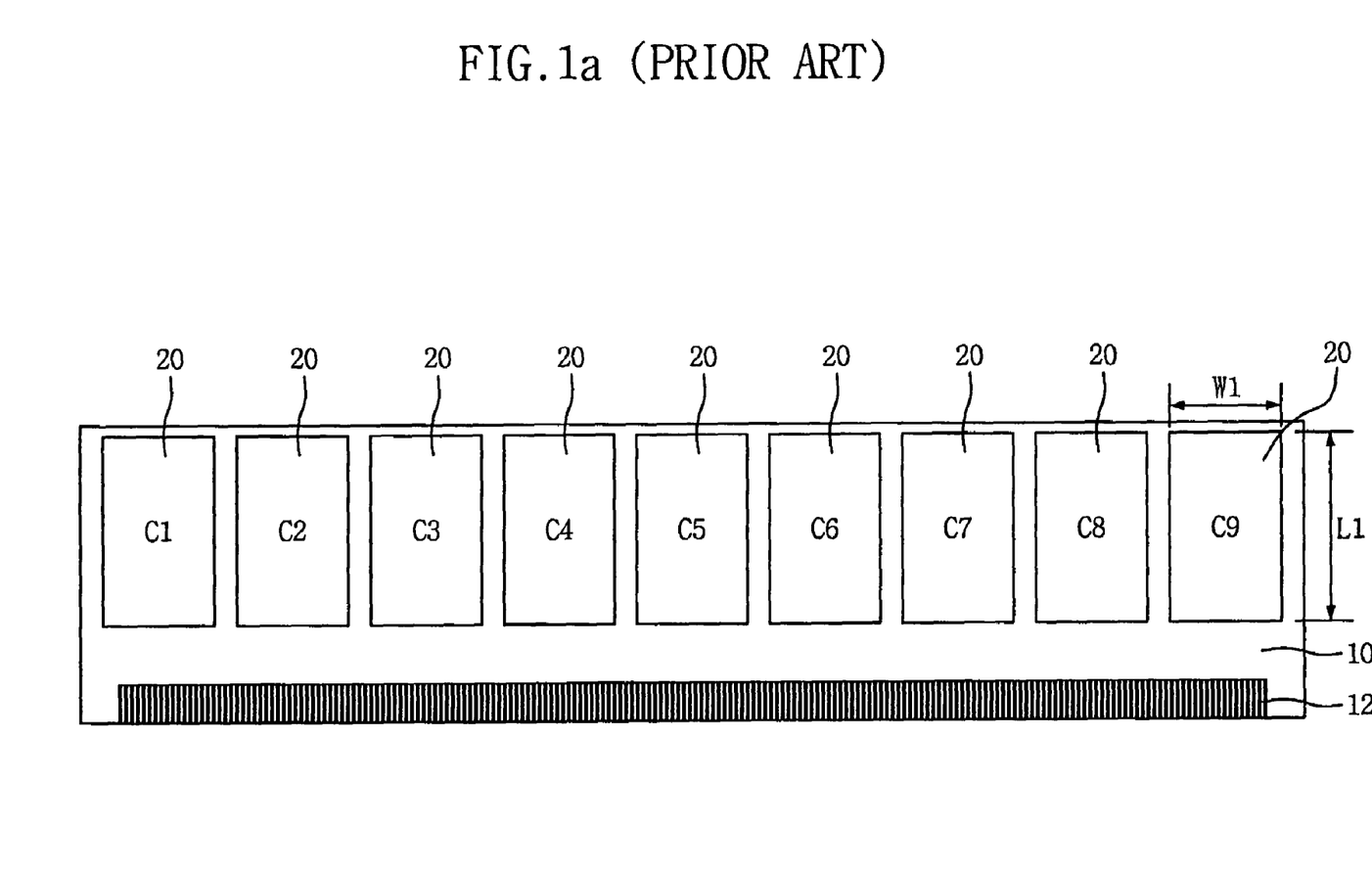
FIGS. 1*a* and 1*b* illustrate a mounting structure of a general integrated circuit module as respective examples.

FIG. 1a illustrates an example IC module mounting structure. Referring to FIG. 1a, a plurality of DRAM packages 20 are mounted on a wiring board 10. The wiring board 10 is made of a rectangular glass epoxy resin sheet, and contains connector pins 12 to electrically connect with a mother board. The DRAM packages 20 encapsulate DRAM chips and connect with the wiring board 10 through connection balls such as a ball grid array (BGA) or through a plurality of leads. DRAM packages 20 have a predetermined width W1 and length L1, as shown in the drawing.

Figure 1B:
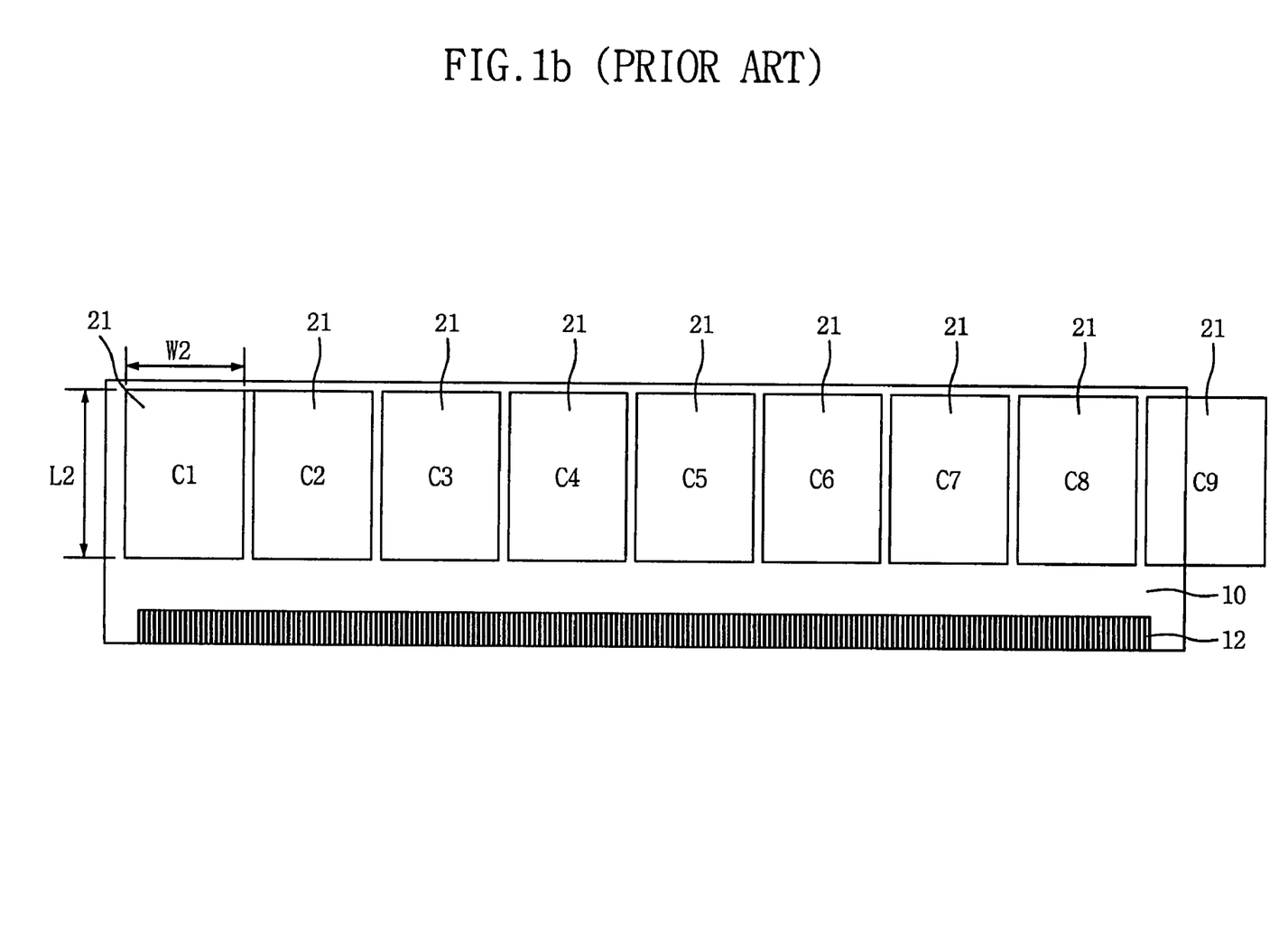

As memory capacity increases, width W1 can be increased to width W2, as shown in FIG. 1b. As shown in the figure, it may be difficult or impossible for an integrated circuit module to contain all nine DRAM packages 21 on the wiring board 10. Consequently, width W2, for DRAM package 21 in FIG. 1b, is larger than width W1 for DRAM package 20 shown in FIG. 1a, limiting mounting space of the wiring board 10. A long side of the wiring board 10 is currently about 133.35 mm. Consequently, referring to FIG. 1b, a ninth package C9 may only be mounted by changing the memory module form factors, consequently causing compatibility and efficiency problems. Length, such as length L2 of memory packages in FIG. 1b, may also be adjusted in comparison with length L1 of FIG. 1a, but it may still be insufficient to mount all the packages, as represented in FIG. 1b.

Therefore, a need remains to be able to mount a chip or packages within a limited space. Previous approaches to improve mounting density of semiconductor integrated circuit packages prove insufficient. For example, U.S. Pat. No. 6,169,325 granted to Azuma et al. on Jan. 2, 2001, discloses tiltably mounting tape carrier packages (TCPs) on a wiring board with a determined angle. In Azuma this is accomplished with a supporting lead.

However, the approach in Azuma is complicated, particularly in tiltably constructing an integrated circuit module through use of a supporting lead. This problem is further complicated for BGA type memory packages.

Therefore, there is a need for mounting a plurality of packages in a limited space without changing integrated circuit form factors. Additionally, this need exists as integrated circuit packages increase in size.

SUMMARY OF THE PRESENT INVENTION

Example embodiments of the present invention may provide an integrated circuit module, and a structure thereof, to effectively mount a plurality of packages in a limited space. In an embodiment, packages may be mounted with conventional form factors. Packages may also be mounted with bigger integrated circuit packages. Embodiments may mount ball grid array (BGA) type semiconductor memory packages with high-density. Further, an embodiment can mount bigger packages on an existing wiring board without reducing the number of packages.

Further, example embodiments may provide an improved memory card structure, a memory module mounting structure, and methods thereof, allowing three-dimensional mounting of memory chips of increased size on a wiring board. Example embodiments allow previous mounting methods without changing wiring boards, even when memory chips or packages increase in size and subsequently return to previous sizes.

According to one aspect of the present invention, the structure of the integrated circuit module may include a wiring board which has a mounting space having a mounting length determined in a first direction and a mounting width determined in a second direction on at least one surface thereof and a plurality of integrated circuit packages having a package mounting combination length longer than the mounting length of the wiring board. Some chips among the plurality of integrated circuit packages can be mounted directly on the mounting space, and other chips can be mounted indirectly on the mounting space. In an embodiment chips may be overlapped horizontally by being vertically distant from one another.

According to an embodiment method, some packages may be directly mounted among a plurality of integrated circuit packages on a mounting space while other packages may be indirectly mounted on the mounting space. In an embodiment, packages may be overlapped horizontally by being vertically distant from one another. The indirectly mounted packages can be stepped with the directly mounted packages through a connection with each corresponding interposer.

Accordingly, in a structure and mounting method of an integrated circuit module, there are advantages of effectively mounting a plurality of chips or packages in a limited space without changing form factors. Furthermore, the plurality of chips may be mounted in such fashion even when the integrated circuit chip or package increases in size. Additionally, a structure and mounting method may be used even while mounting increased size packages on the wiring board without changing the number of packages. Likewise, the mounting method disclosed herein may easily change to a previously-applied mounting method without changing the wiring board, even when memory chip or package size increases and then again is reduced.

BRIEF DESCRIPTION OF THE DRAWINGS

The above and other features of exemplary embodiments of the present invention will become readily apparent from the description that follows, with reference to the attached drawings in which.

DETAILED DESCRIPTION OF EXEMPLARY EMBODIMENTS OF THE INVENTION

Embodiments of the present invention are more fully described below with reference to FIGS. 2 through 9 in which like components have been provided with like reference symbols and numerals. The present invention may, however, be embodied in many different forms and should not be construed as being limited to the example embodiments set forth herein. Rather, these embodiments are provided so that this disclosure is thorough and complete.

Figure 2:
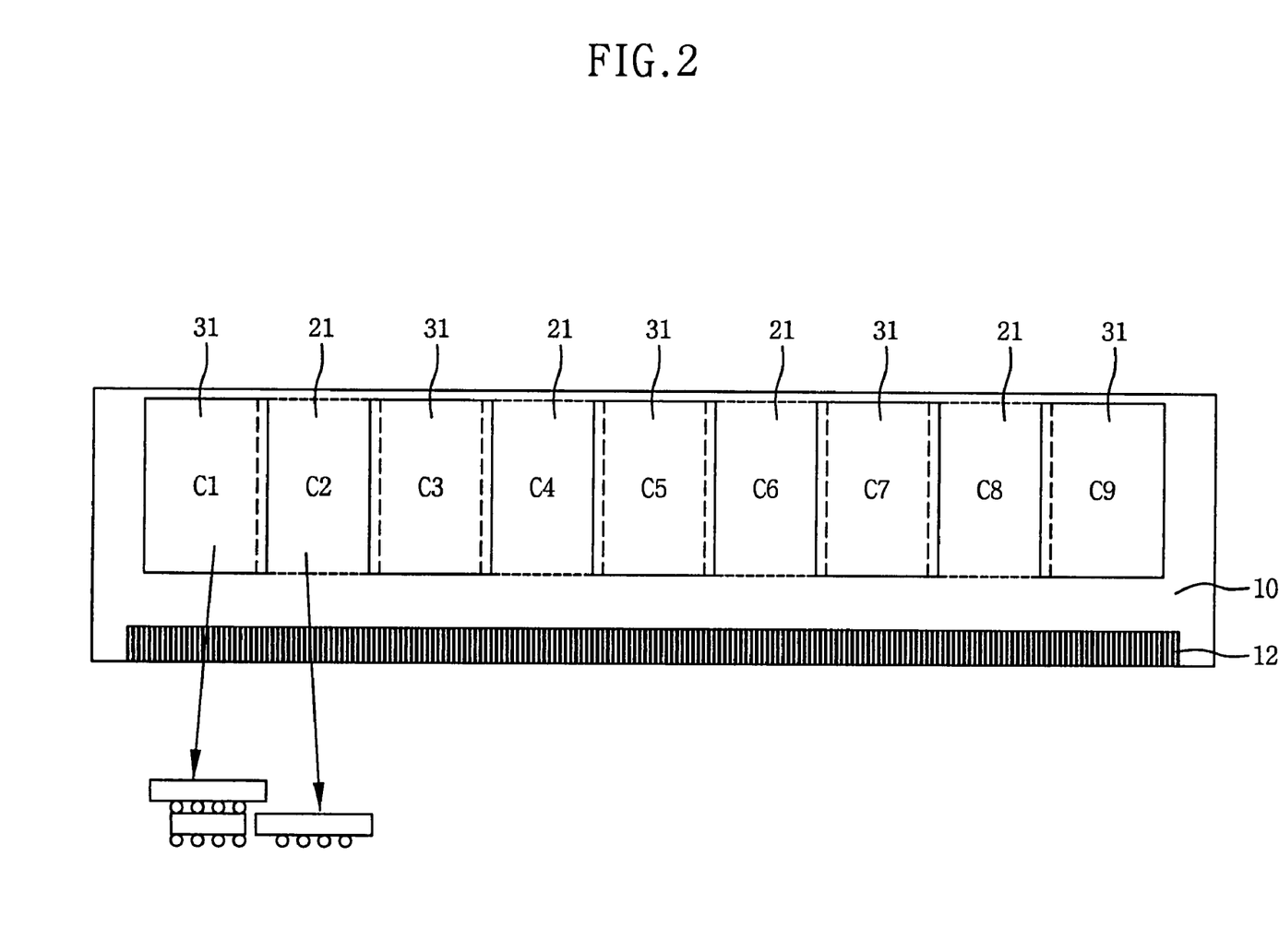
FIG. 2 is a plan view illustrating a mounting structure of an integrated circuit module according to an aspect of the present invention.

FIG. 2 is a plan view showing an embodiment mounting structure of an integrated circuit module. Referring to FIG. 2, the integrated circuit module includes a wiring board 10 which has a mounting space. The mounting space has a mounting length determined in a first direction as a long side direction, and a mounting width determined in a second direction as a short side direction, on at least one surface thereof. The wiring board also has a plurality of integrated circuit packages C1–C9 having a package mounting combination length longer than the mounting length of the wiring board 10. Some packages 21 among the plurality of integrated circuit packages C1–C9 are mounted directly on the mounting space, and other packages 31 are mounted indirectly on the mounting space. The packages 21 and 31 may be overlapped horizontally while being vertically distant from one another.

In the present embodiment, the package mounting combination length refers to the sum the of respective width dimensions of the plurality of integrated circuit packages C1–C9, as well as the sum of the interval spacing between each of the plurality of integrated circuit packages C1–C9. The mounting length of the wiring board 10 may indicate an effective mounting size determined for a first direction (the length direction) of the wiring board 10. Furthermore, the effective mounting size may be determined by the wiring board 10, and may exclude an edge margin size of the wiring board 10 and a mounting space of other electronic circuit devices.

In this configuration, form factor of the integrated circuit module need not be changed and a plurality of chips or packages can be effectively mounted in a limited mounting space.

Further, in FIG. 2, the "overlapped" described above indicates a horizontal overlay, generating a stepped coverage vertically and in three dimensions. That is, the stepped coverage is formed vertically between the adjacent memory chips or packages for a high-density mounting. This structure allows for horizontal overlapping of the edge portions of the integrated circuit packages 21 and 31. Therefore, existing integrated circuit module form factors can be used, allowing mounting of integrated circuit products which were conventionally difficult to effectively mount. In an embodiment, the chips, modules, and any mounted device may be parallel with the wiring board 10.

In FIG. 2, packages 31 can be electrically connected with the wiring board 10 through corresponding interposers.

As was described above for the mounting structure of the integrated circuit module referred to in FIG. 2, the mounting may easily change to a previously-applied mounting without changing the wiring board, even when memory chip or package size increases and then again is reduced.

Figure 3:
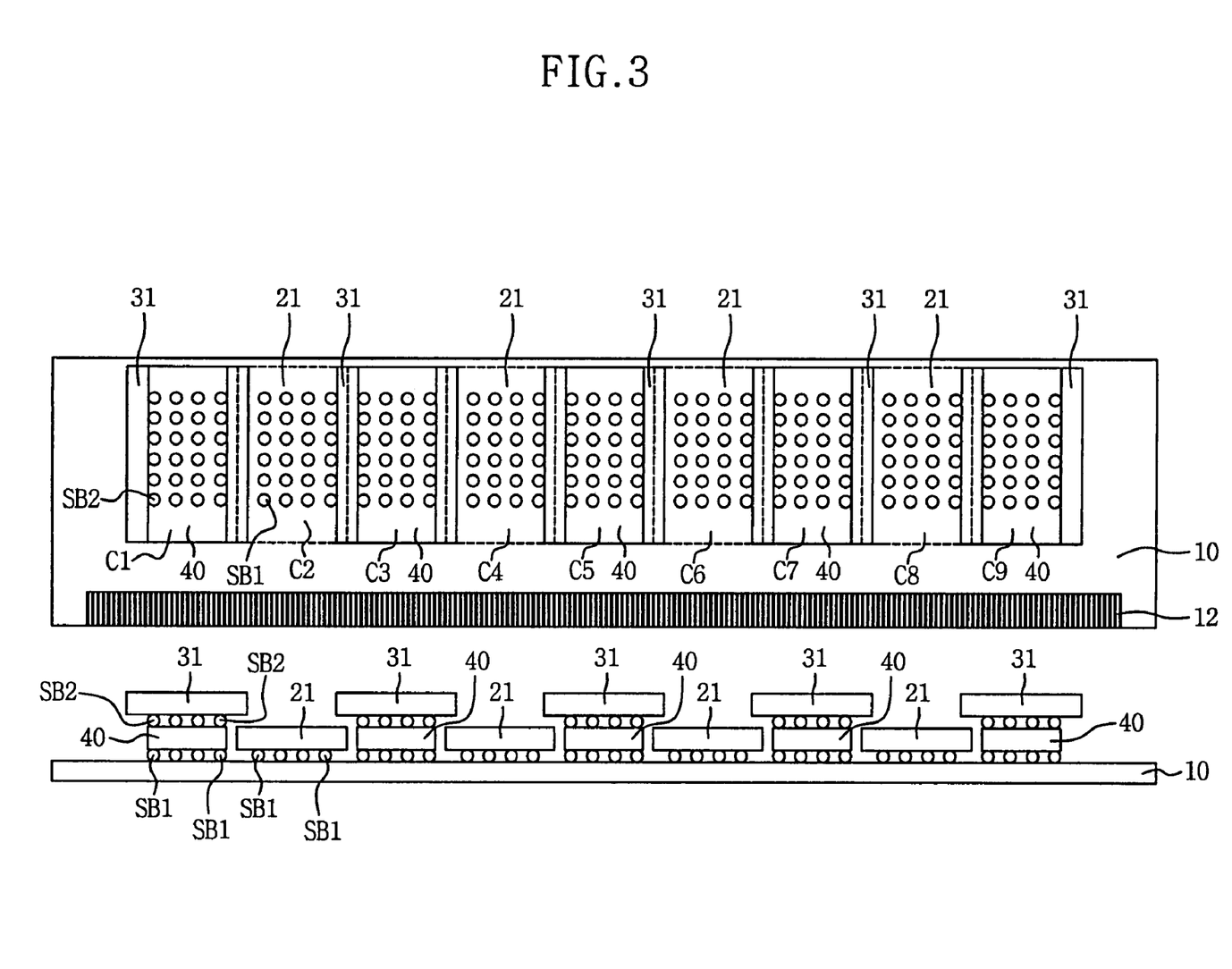
FIG. 3 shows a first example embodiment of the present invention with reference to FIG. 2.

FIG. 3 illustrates in detail a first example embodiment. With reference to FIG. 3, there is a first integrated circuit package group C2, C4, C6, C8, that may be composed of a plurality of integrated circuit packages 21 and can be mounted directly on a mounting space of the wiring board. Additionally, a second integrated circuit package group C1, C3, C5, C7, C9, can comprise a plurality of integrated circuit packages 31 and can be mounted indirectly on the mounting space. The second integrated circuit package group can be overlapped horizontally with packages from the first integrated circuit package group C2, C4, C6, C8, by being vertically distant from each other.

Further, a plurality of interposers 40 may be individually connected with the packages 31 of the second integrated circuit package group C1, C3, C5, C7, C9, to electrically interface the packages and the wiring board 10. These interposers allow mounting even when the package mounting combination length of the integrated circuit packages contained in the first and second integrated circuit package group C1–C9 is longer than a mounting length of the wiring board 10.

Although embodiment module mounting structures do not require an interposer 40 as shown in FIG. 3, the mounting structure using the interposer 40 requires little, if any, change to the conventional mounting method.

Figure 4:
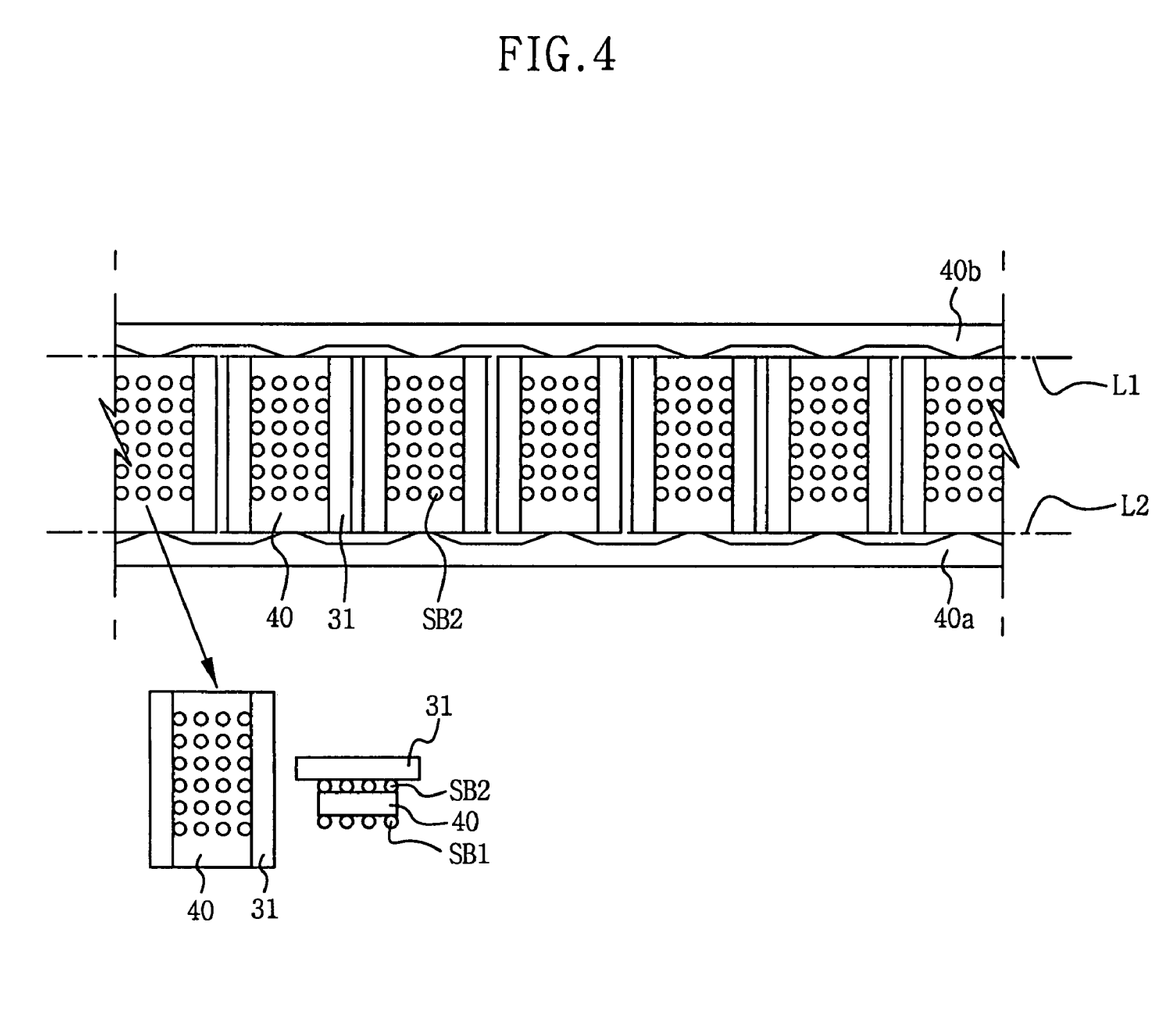
FIG. 4 illustrates a manufacturing of an integrated circuit package connected with an interposer, in reference to FIG. 3.

FIG. 4 illustrates an integrated circuit package connected with the interposer referred to in FIG. 3. The packages 31 of the second integrated circuit package group C1, C3, C5, C7, C9 shown in FIG. 3 may be flip chip connected with each interposer 40 through solder balls. Therefore, for the packages 31 as shown in FIG. 4, an interposer base plate 40*a* and an interposer base plate 40*b* may be separately processed by cutting along a cutting line L2 of an interposer base plate 40*a* shown in a lower part of the drawing and along a cutting line L1 of an interposer base plate 40*b* shown in an upper part of the drawing.

In FIGS. 3 and 4, a solder ball to electrically connect a package 31 and an interposer 40, namely, an upper solder ball SB2, may be made of a high melting point material as compared with a lower solder ball SB1. Using a higher melting point material prevents a void, etc., in a junction when the upper solder ball SB2 melts and then again hardens in connecting the package connected to the interposer 40 with the wiring board 10. If a void is generated, electrical disconnection may result, causing a junction defect. Generally, there may be no problems with solder balls having similar melting points, however, using solder balls with separate melting points may prevent a junction defect in advance.

Figure 5:
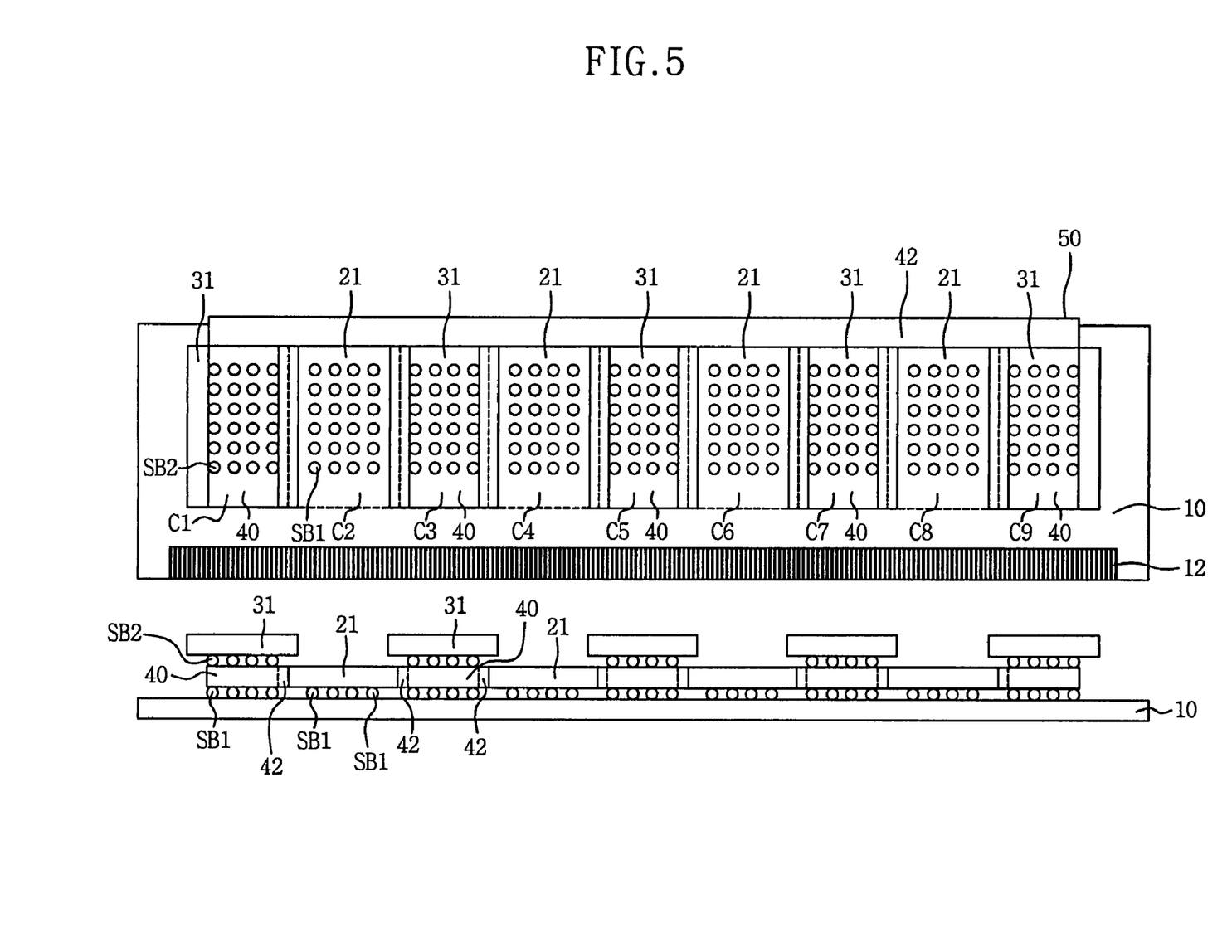
FIG. 5 illustrates a mounting structure of integrated circuit module according to a second example embodiment.
Figure 6:
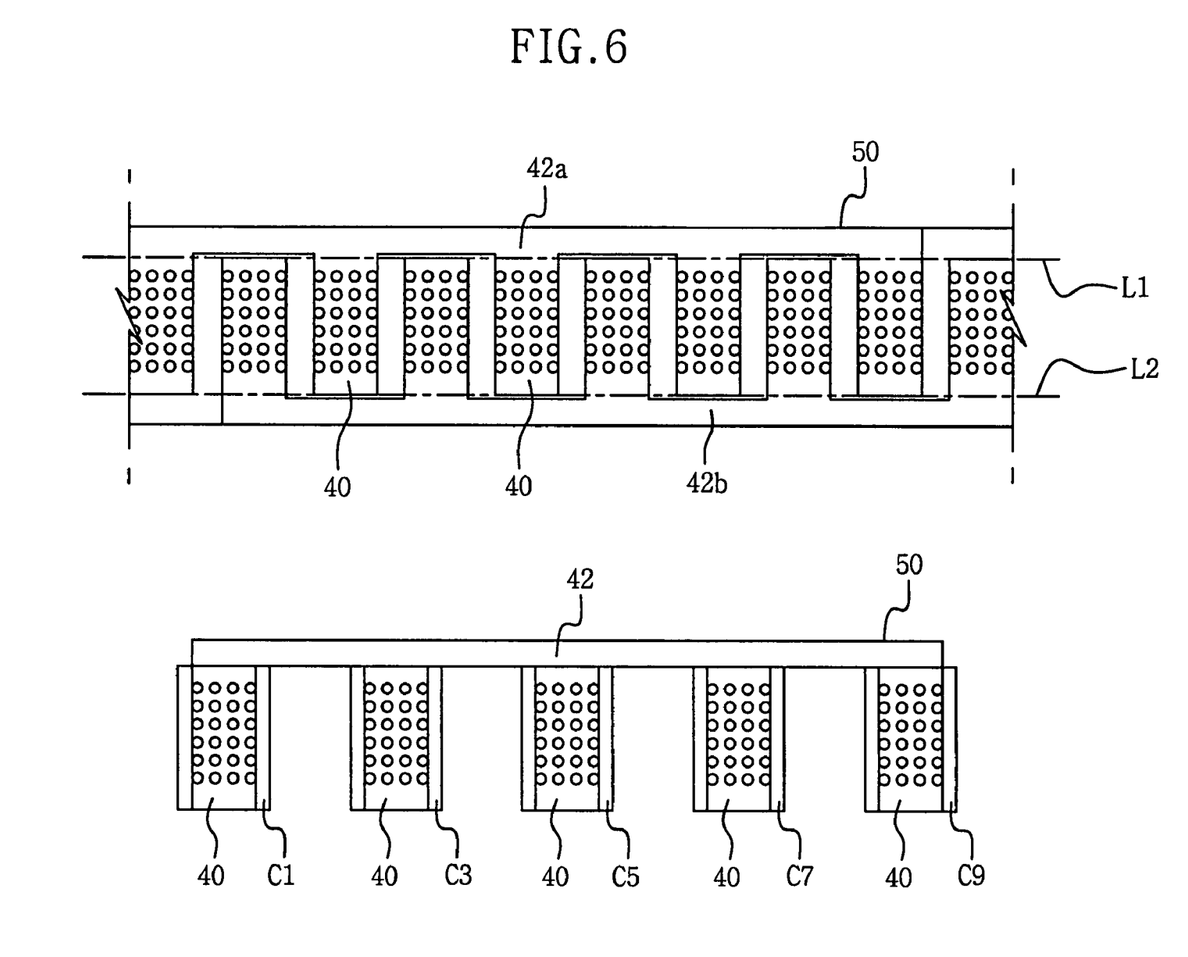
FIG. 6 illustrates an interposer module in reference to FIG. 5.

FIG. 5 illustrates in detail the mounting structure of the integrated circuit module according to a second example embodiment of the present invention. FIG. 6 illustrates a manufacturing of an interposer module referred to FIG. 5.

In FIG. 5, packages 31 of a second integrated circuit package group C1, C3, C5, C7, C9 may be connected with corresponding interposers 40. Additionally, packages 31 may be connected with one another without being separated by an interposer module 50. This mounting structure simplifies mounting. In comparing the structure of FIG. 5 with FIG. 3, FIG. 5 contains a connection 42 disposed on the wiring board 10 along the exterior of the mounting space. The respective interposers 40 may become one body, shaped like a comb, without being separated from each other.

The packages 31 of the second integrated circuit package group C1, C3, C5, C7, C9 may be flip chip connected with each interposer 40 through solder balls, and then may be selectively cut along the cutting lines L1, L2 as shown in FIG. 6, to provide a comb-like module portion as shown in a lower part of the drawing.

Figure 7:
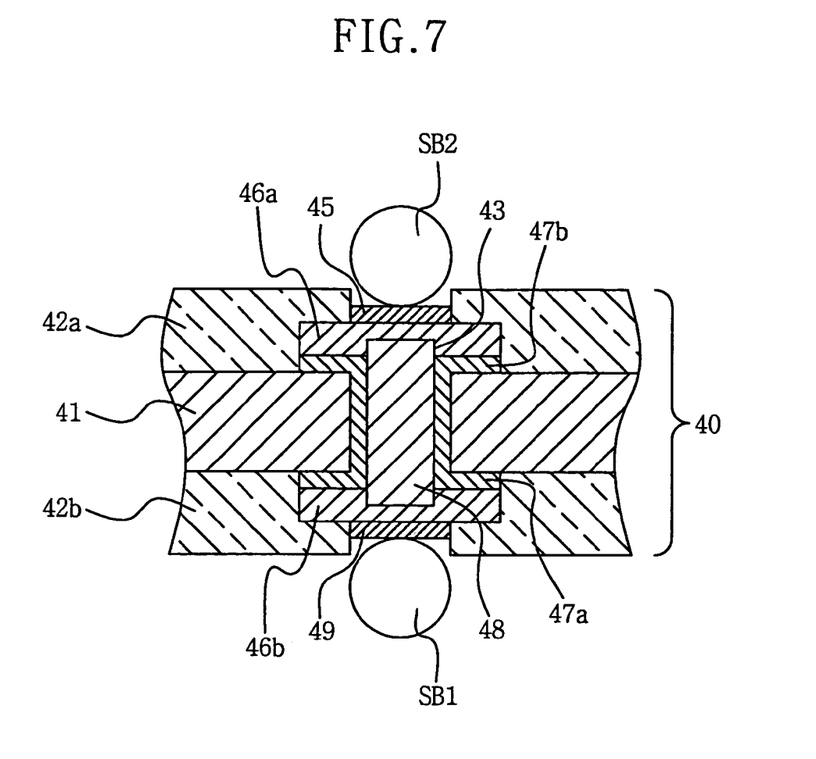
FIGS. 7 through 9 illustrate various examples for interposer structures according to example embodiments.
Figure 8:
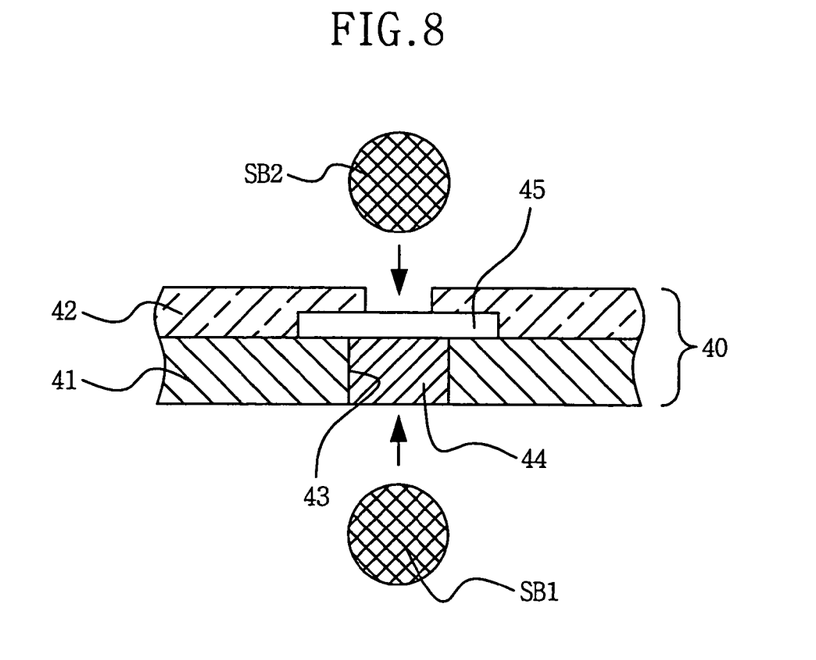
Figure 9:
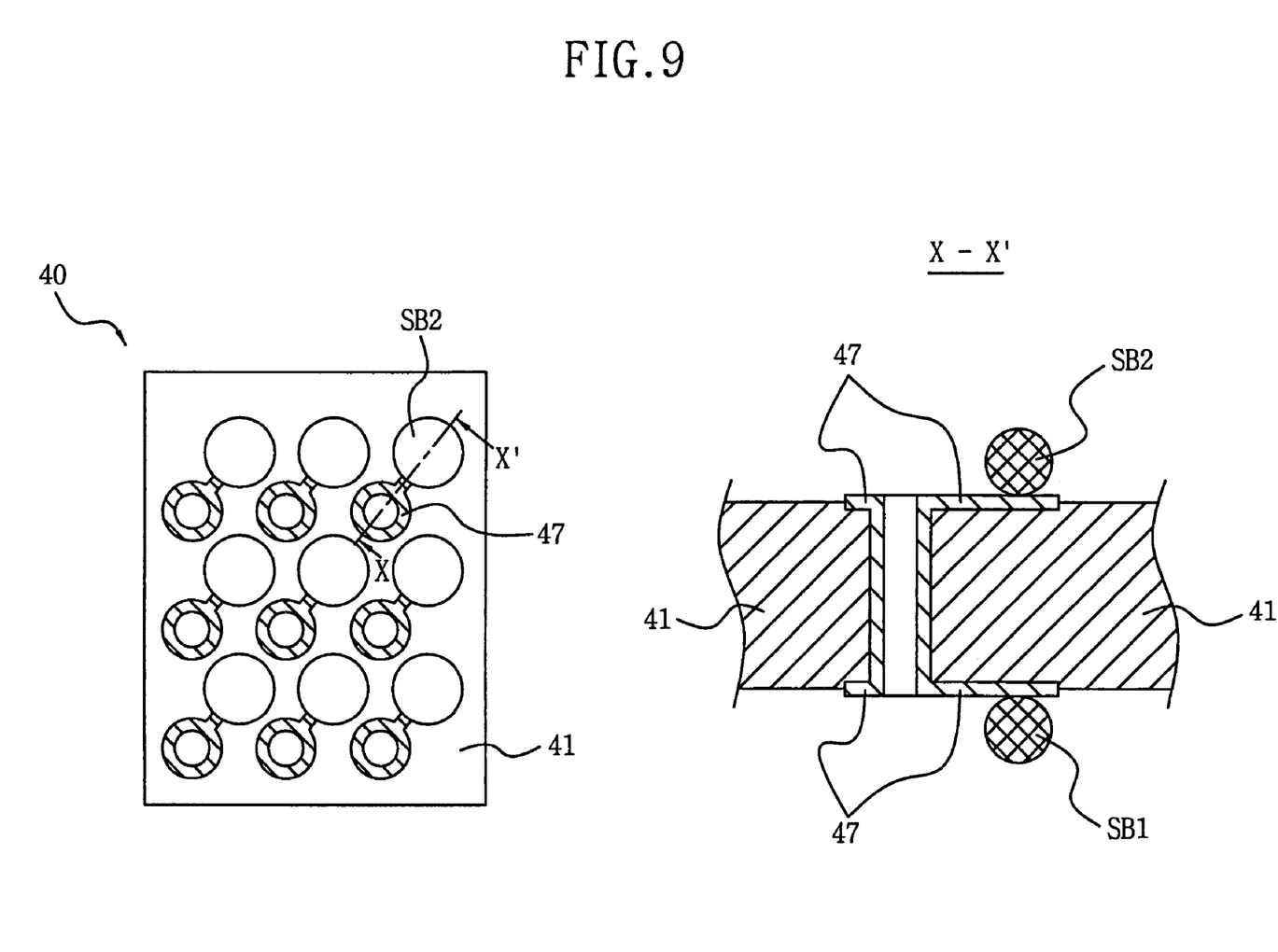

FIGS. 7 through 9 illustrate respective examples of an interposer structure used according to example embodiments.

Referring first to FIG. 7, an interposer 40 may contain a base member 41. An example base member 41 may comprise resin material formed through a patterning of copper thin plates 47a, 47b formed on both faces thereof. The copper thin plates 47a, 47b can be connected with one another through a contact part of copper material formed on a side face of a through-hole. Reference numbers 42a, 42b, an 48 all indicate an insulation register layer for a laminating insulation. The copper thin plates 47a, 47b may each be electrically connected to bonding pattern layers 46a, 46b. The upper and lower pad electrodes 45, 49 can thus be exposed through an aperture of the insulation register layers 42a, 42b, and each can be formed correspondingly to the bonding pattern layers 46a, 46b. In the interposer 40 structure shown in FIG. 7, the solder bumps SB2 and SB1 are electrically connected.

Referring to structure illustrated in FIG. 8, an interposer 40 may contain a base member 41 of insulation resin material to formed a pad electrode 45 on. The pad electrode 45 may electrically contact conductive plug 44. Conductive plug 44 fills the through-hole 43 of the base member 41. The insulation register layer 42 may cover an upper surface of the base member and a portion of the pad electrode 45. In the structure of the interposer 40 referred to FIG. 8, the solder balls (bumps) SB2, SB1 are electrically connected with one another.

Referring to FIG. 9, an interposer 40 may comprise a simple structure which renders a filling process unnecessary for the interior of the through-hole. In FIG. 9, the left drawing illustrates a plan view and the right drawing shows a sectional view taken along line X–X' of the plan view. The solder balls SB2, SB1 may be electrically connected with each other through a conductive thin film 47 of copper etc. formed in an inner wall of the through-hole and on both faces of the base member 41. This allows, but does not require, the solder balls SB2, SB1 to not be disposed vertically from upper and lower parts of the through-hole. In the interposer 40 structure referred to in FIG. 9, manufacturing is simplified relative to FIG. 7. Furthermore, in FIG. 9 the structure omits the need to fill up the interior of the through-hole. In addition, the solder balls SB2 and SB1 can be soldered with the conductive thin film 47 formed on both faces of the base member 41 and beyond the through-hole, thus increasing electrical connection reliability.

A plurality of interposers, which may include interposer module 50 and interposer 40, can be formed in one body. This allows packages 31 of a second integrated circuit package group C1, C3, C5, C7, C9 to be horizontally overlapped with packages 21 of a first integrated circuit package group C2, C4, C6, C8, by being vertically distant from each other.

As was described above, in a structure of integrated circuit module, a plurality of chips or packages can be effectively mounted in a limited space without changing form factors of integrated circuit modules. This is true even when integrated circuit chip or package size increases. In addition, a larger package may be mounted on a wiring board without reducing the number of packages, the mounting or mounting method may easily be changed to a previously-applied mounting or mounting method without changing the wiring board, even when memory chip or package size increases and then again is reduced.

It will be apparent to those skilled in the art that modifications and variations can be made without deviating from the spirit or scope of the invention. Accordingly, these and other changes and modifications are seen to be within the spirit and scope of the invention as defined by the appended claims and their equivalents.

What is claimed is:

1. An integrated circuit module, comprising:
   a substrate having a mounting space;
   a first plurality of integrated circuit packages directly mounted on the mounting space of the substrate;
   a plurality of interposers directly mounted on the mounting space of the substrate, wherein the plurality of interposers are alternately mounted between the first plurality of integrated circuit packages such that each of the first plurality of integrated circuit packages is mounted adjacent to at least one of the interposers; and
   a second plurality of integrated circuit packages mounted respectively on the plurality of interposers such that at least some packages of the second plurality of integrated circuit packages partially overlap packages of the first plurality of integrated circuit packages.

2. The module of claim 1, wherein the mounting space of the substrate has a shorter mounting length than a combination mounting length of the plurality of integrated circuit packages.

3. The module of claim 1, wherein the integrated circuit packages are substantially the same size.

4. The module of claim 1, wherein a mounting width of the substrate is at least the same as the width of the integrated circuit packages.

5. The module of claim 1, wherein at least some of the plurality of integrated circuit packages are substantially parallel with the substrate.

6. An integrated circuit module comprising:
   a wiring board including a mounting space and a plurality of connector pins for electrically connecting the wiring board to a mother board;
   at least one integrated circuit package mounted directly on the mounting space of the wiring board;

at least one interposer mounted on the mounting space of the wiring board, wherein the interposer is mounted to be adjacent to the directly mounted integrated circuit package; and at least one integrated circuit package mounted on the interposer such that the integrated circuit package mounted on the interposer partially overlaps the directly mounted integrated circuit package.

7. The module of claim 6, wherein the at least one integrated circuit package mounted on the interposer is electrically connected to the interposer through a plurality of solder balls.

8. An integrated circuit module comprising:

a wiring board including a mounting space and a plurality of connector pins for electrically connecting the wiring board to a mother board;

a first plurality of integrated circuit packages mounted directly on the mounting space of the wiring board;

a plurality of interposers mounted on the mounting space of the wiring board, wherein the plurality of interposers are alternately mounted between the first plurality of integrated circuit packages such that each of the first plurality of integrated circuit packages is mounted adjacent to at least one of the interposers; and a second plurality of integrated circuit packages respectively mounted on the plurality of interposers, each of the second plurality of packages electrically connected to one of the plurality of interposers through a plurality of solder balls, wherein at least some of the second plurality of packages partially overlap the directly mounted first integrated circuit packages.

9. The module of claim 8, wherein the plurality of interposers are connected to each other through an interposer module outside of the mounting space.

* * * * *